US011753719B2

(12) United States Patent
Mo et al.

(10) Patent No.: US 11,753,719 B2
(45) Date of Patent: Sep. 12, 2023

(54) FLOW RATE CONTROL METHOD, FLOW RATE CONTROL DEVICE, AND FILM FORMING APPARATUS

(71) Applicant: TOKYO ELECTRON LIMITED, Tokyo (JP)

(72) Inventors: Kennan Mo, Nirasaki (JP); Kouichi Sekido, Nirasaki (JP); Takanobu Hotta, Nirasaki (JP); Nagayasu Hiramatsu, Hillsboro, OR (US); Atsushi Matsumoto, Nirasaki (JP); Kensaku Narushima, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 311 days.

(21) Appl. No.: 16/352,264

(22) Filed: Mar. 13, 2019

(65) Prior Publication Data
US 2019/0284698 A1     Sep. 19, 2019

(30) Foreign Application Priority Data
Mar. 16, 2018  (JP) .................................. 2018-050092

(51) Int. Cl.
C23C 16/52         (2006.01)
(52) U.S. Cl.
CPC .................................... *C23C 16/52* (2013.01)
(58) Field of Classification Search
CPC .................................................... C23C 16/52
See application file for complete search history.

(56) References Cited

U.S. PATENT DOCUMENTS

| 2012/0116596 | A1* | 5/2012 | Yoneda | ................ | G05D 7/0635 |
| | | | | | 700/282 |
| 2014/0209022 | A1* | 7/2014 | Inoue | ................ | C23C 16/45561 |
| | | | | | 118/712 |
| 2014/0299206 | A1* | 10/2014 | Nagase | ............... | C23C 16/4482 |
| | | | | | 137/551 |

(Continued)

FOREIGN PATENT DOCUMENTS

| JP | 2006-222133 A | 8/2006 |
| JP | 2012-103812 A | 5/2012 |
| JP | 2016-186094 A | 10/2016 |

OTHER PUBLICATIONS

Boyd et al. A New Device for Highly Accurate Gas Flow Control With Extremely Fast Response Times, IEEE/SEMI Advanced Semiconductor Manufacturing Conference, May 2011. (Year: 2011).*

*Primary Examiner* — Kelly M Gambetta
(74) *Attorney, Agent, or Firm* — Nath, Goldberg & Meyer; Jerald L. Meyer; Tanya E. Harkins (57) ABSTRACT

A method of controlling flow rate in a gas supply device for supplying a mixed gas containing a raw material gas, which is generated by vaporizing a raw material in a raw material container, and a carrier gas, includes: supplying the mixed gas at a predetermined target flow rate; acquiring a flow rate of the mixed gas when supplying the mixed gas; specifying a stable range of the flow rate of the mixed gas acquired when acquiring the flow rate; calculating a representative value of flow rates of the mixed gas in the stable range specified when specifying the stable range; and correcting the target flow rate based on the representative value calculated when calculating the representative value and the target flow rate.

8 Claims, 9 Drawing Sheets

(56) References Cited

U.S. PATENT DOCUMENTS

2015/0275367 A1* 10/2015 Moroi ............... C23C 16/45544
427/255.28
2017/0092549 A1* 3/2017 Yagi .................... C23C 16/4481
2019/0177850 A1* 6/2019 Shimizu .................. C23C 16/52

* cited by examiner

FLOW RATE CONTROL METHOD, FLOW RATE CONTROL DEVICE, AND FILM FORMING APPARATUS

CROSS-REFERENCE TO RELATED APPLICATION

This application is based upon and claims the benefit of priority from Japanese Patent Application No. 2018-050092, filed on Mar. 16, 2018, the entire contents of which are incorporated herein by reference.

TECHNICAL FIELD

The present disclosure relates to a flow rate control method, a flow rate control device, and a film forming apparatus.

BACKGROUND

There is known a method in which a concentration of a raw material in a mixed gas supplied from a raw material container is measured, and an amount of a carrier gas introduced is controlled using a proportional-integral-derivative (PID) control based on the concentration of the raw material. As such, the flow rate of a raw material gas defined by multiplying the introduction amount of the carrier gas and the concentration of the raw material in the mixed gas is kept constant.

However, in a method used to generate a raw material gas by vaporizing a raw material contained in a raw material container, a flow rate of the raw material gas is not stabilized immediately after a supply of a mixed gas begins. Therefore, in some cases, it is difficult to adjust the flow rate of the raw material gas with high accuracy.

SUMMARY

Some embodiments of the present disclosure provide a technique capable of adjusting a flow rate of a raw material gas with high accuracy.

According to one embodiment of the present disclosure, there is provided a method of controlling flow rate in a gas supply device for supplying a mixed gas containing a raw material gas, which is generated by vaporizing a raw material in a raw material container, and a carrier gas. The method includes: supplying the mixed gas at a predetermined target flow rate; acquiring a flow rate of the mixed gas when supplying the mixed gas; specifying a stable rang of the flow rate of the mixed gas acquired when acquiring the flow rate; calculating a representative value of flow rates of the mixed gas in the stable range specified when specifying the stable range; and correcting the target flow rate based on the representative value calculated when calculating the representative value and the target flow rate.

According to another embodiment of the present disclosure, there is provided a control device of a gas supply device for supplying a mixed gas containing a raw material gas, which is generated by vaporizing a raw material in a raw material container, and a carrier gas. The control device includes: a supply control part configured to supply the mixed gas at a predetermined target flow rate; an acquisition part configured to acquire a flow rate of the mixed gas; a specification part configured to specify a stable range of the flow rate of the mixed gas acquired by the acquisition part; a calculation part configured to calculate a representative value of flow rates of the mixed gas in the stable range specified by the specification part; and a correction part configured to correct the target flow rate based on the representative value calculated by the calculation part and the target flow rate.

According to another embodiment of the present disclosure, there is provided a film forming apparatus provided with a gas supply device for supplying a mixed gas containing a raw material gas, which is generated by vaporizing a raw material in a raw material container, and a carrier gas. The apparatus includes: a processing container; a supply control part configured to supply the mixed gas at a predetermined target flow rate and introduce the mixed gas into the processing container; an acquisition part configured to acquire a flow rate of the mixed gas; a specification part configured to specify a stable range of the flow rate of the mixed gas acquired by the acquisition part; a calculation part configured to calculate a representative value of flow rates of the mixed gas in the stable range specified by the specification part; and a correction part configured to correct the target flow rate based on the representative value calculated by the calculation part and the target flow rate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Film Forming Apparatus]

Figure 1:
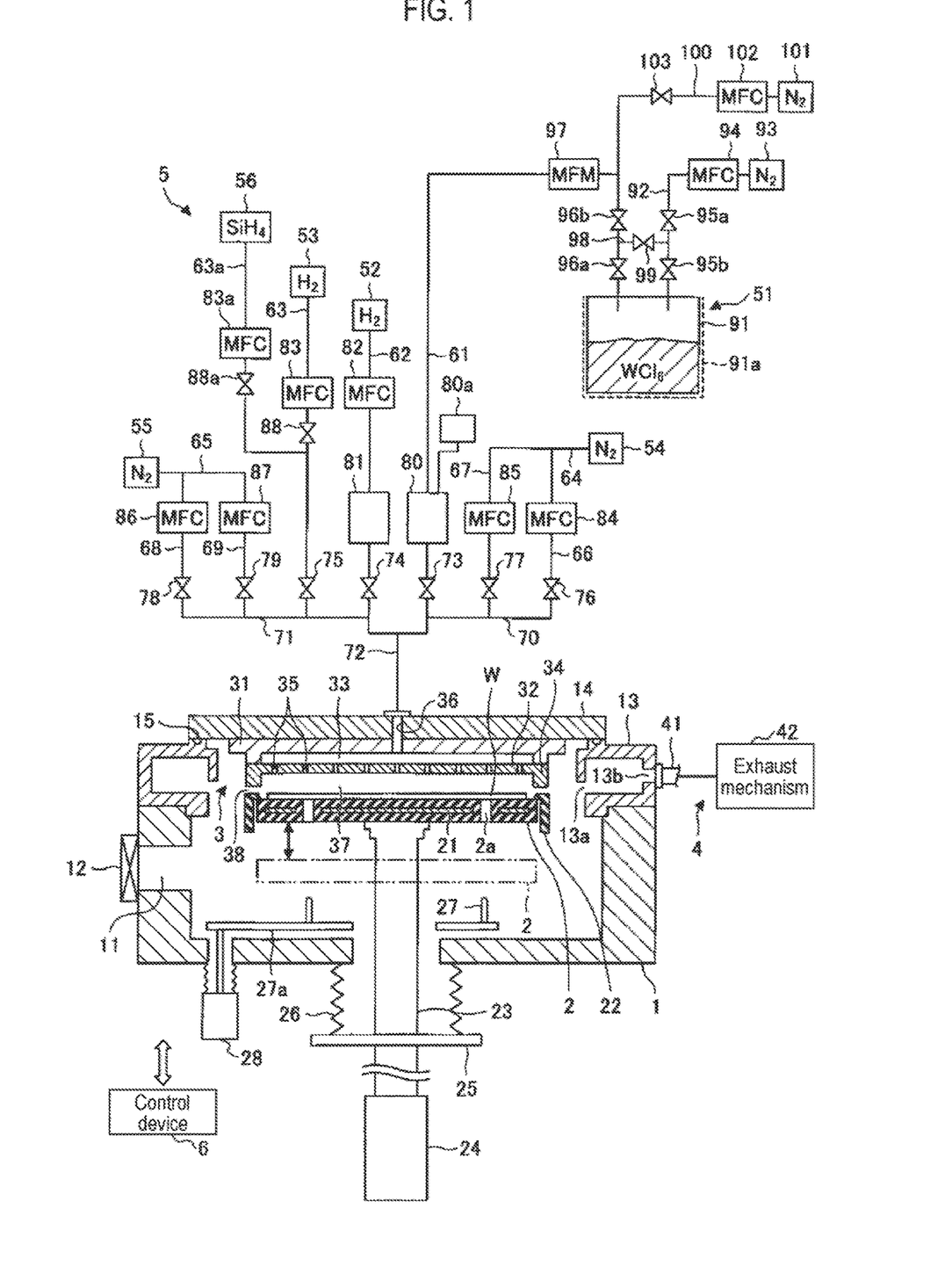
FIG. 1 illustrates a schematic sectional view showing an example of a film forming apparatus provided with a gas supply device.

FIG. 1 is a schematic sectional view showing an example of a film forming apparatus having a gas supply device. The film forming apparatus of FIG. 1 is an apparatus capable of performing film formation by, for example, an atomic layer deposition (ALD) method or a chemical vapor deposition (CVD) method. As shown in FIG. 1, the film forming apparatus includes a processing container 1, a susceptor 2, a shower head 3, an exhaust part 4, a processing gas supply mechanism 5, and a control device 6.

The processing container 1 is made of metal such as aluminum or the like and has a substantially cylindrical shape. A loading/unloading port 11 for loading or unloading a semiconductor wafer (hereinafter referred to as "wafer W/"), which is an example of a substrate, is formed on a side wall of the processing container 1. The loading/unloading port 11 can be opened and closed by a gate valve 12. An annular exhaust duct 13 having a rectangular section is provided in a main body of the processing container 1. A slit 13a is formed in the exhaust duct 13 along an inner peripheral surface of the exhaust duct 13. An exhaust port 13b is formed in an outer wall of the exhaust duct 13. A top wall 14 is provided on an upper surface of the exhaust duct 13 so as to close an upper opening of the processing container 1. A gap between the top wall 14 and the exhaust duct 13 is hermetically sealed by a seal ring 15.

The susceptor 2 supports the wafer W in the processing container 1 in a horizontal position. The susceptor 2 has a disk shape having a size corresponding to the wafer W and is supported by a support member 23. The susceptor 2 is made of a ceramic material such as aluminum nitride (AlN) or the like, or a metallic material such as aluminum or a nickel-based alloy. A heater 21 for heating the wafer W is embedded in the susceptor 2. The heater 21 is configured to generate heat using electric power supplied from a heater power supply (not shown). Output of the heater 21 is controlled according to a temperature signal of a thermocouple (not shown) provided in the vicinity of a wafer mounting surface formed in an upper surface of the susceptor 2. Thus, a temperature of the wafer W is set to a predetermined temperature.

The susceptor 2 is provided with a cover member 22 made of ceramics such as alumina or the like so as to cover an outer peripheral region of the wafer mounting surface and a side surface of the susceptor 2.

The support member 23 supporting the susceptor 2 extends downward from a center of a bottom surface of the susceptor 2 and reaches below the processing container 1 through a hole formed in a bottom wall of the processing container 1. A lower end of the support member 23 is connected to an elevating mechanism 24. The elevating mechanism 24 moves the susceptor 2 upward and downward via the support member 23, between a processing position shown in FIG. 1 and a transfer position below the processing position. The transfer position is a position where wafer transfer can be performed, and is indicated in FIG. 1 by an alternate long and short dashed line. A flange portion 25 is attached to a portion of the support member 23 below the processing container 1. A bellows 26 is provided between the bottom surface of the processing container 1 and the flange portion 25. The bellows 26 isolates air in the processing container 1 from external air, and expands and contracts along with the upward and downward movement of the susceptor 2.

Three wafer support pins 27 (only two of which are shown in FIG. 1) are provided in the vicinity of the bottom surface of the processing container 1 so as to protrude upward from a lift plate 27a. The wafer support pins 27 can move upward and downward via the lift plate 27a by an elevating mechanism 28 provided below the processing container 1. The wafer support pins 27 are inserted into through holes 2a formed in the susceptor 2 when the susceptor 2 is positioned at the transfer position, and can protrude and retreat with respect to the upper surface of the susceptor 2. By moving the wafer support pins 27 upward and downward in this manner, the wafer W is delivered between a wafer transfer mechanism (not shown) and the susceptor 2.

The shower head 3 supplies a processing gas into the processing container 1 in a shower shape. The shower head 3 is made of metal and is provided so as to face the susceptor 2. The shower head 3 has substantially the same diameter as the susceptor 2. The shower head 3 includes a main body portion 31 fixed to the top wall 14 of the processing container 1 and a shower plate 32 attached to a lower portion of the main body portion 31. A gas diffusion space 33 is formed between the main body portion 31 and the shower plate 32. The gas diffusion space 33 is in communication a gas introduction hole 36 penetrating a center of the main body portion 31 and the top wall 14 of the processing container 1. An annular protrusion 34 protruding downward is formed in a peripheral edge portion of the shower plate 32. Gas discharge holes 35 are formed in a flat surface of the shower plate 32, that is to say, in an inward portion of the annular protrusion 34.

When the susceptor 2 is positioned at the processing position, a processing space 37 is formed between the shower plate 32 and the susceptor 2, and an annular gap 38 is formed as the annular protrusion 34 and an upper surface of the cover member 22 of the susceptor 2 come near each other.

The exhaust part 4 evacuates the inside of the processing container 1. The exhaust part 4 includes an exhaust pipe 41 connected to the exhaust port 13b of the exhaust duct 13 and an exhaust mechanism 42 connected to the exhaust pipe 41. The exhaust mechanism 42 includes a vacuum pump, a pressure control valve, and the like. During processing of the wafer W, gas in the processing container 1 reaches the exhaust duct 13 via the slit 13a. The gas is exhausted from the exhaust duct 13 through the exhaust pipe 41 by the exhaust mechanism 42 of the exhaust part 4.

The processing gas supply mechanism 5 supplies a processing gas to the shower head 3. The processing gas supply mechanism 5 includes a raw material gas supply mechanism 51, a first $H_2$ gas supply source 52, a second $H_2$ gas supply source 53, a first $N_2$ gas supply source 54, a second $N_2$ gas supply source 55, and a $SiH_4$ gas supply source 56. The raw material gas supply mechanism 51 supplies, for example, a $WCl_6$ gas as a metal chloride gas which is a raw material gas. The first $H_2$ gas supply source 52 supplies $H_2$ gas as a reducing gas. The second $H_2$ gas supply source 53 supplies $H_2$ gas as an additive reducing gas. The first $N_2$ gas supply source 54 and the second $N_2$ gas supply source 55 supply $N_2$ gas as a carrier gas and a purge gas. The $SiH_4$ gas supply source 56 supplies $SiH_4$ gas as an initial film forming gas.

The processing gas supply mechanism 5 further includes a raw material gas supply line 61, a first $H_2$ gas supply line 62, a second $H_2$ gas supply line 63, a first $N_2$ gas supply line 64, a second $N_2$ gas supply line 65, and a $SiH_4$ gas supply line 63a. The raw material gas supply line 61 extends from the raw material gas supply mechanism 51. The first $H_2$ gas supply line 62 extends from the first $H_2$ gas supply source 52. The second H₂ gas supply line 63 extends from the second H₂ gas supply source 53. The first N₂ gas supply line 64 extends from the first N₂ gas supply source 54 and supplies N₂ gas to the raw material gas supply line 61. The second N₂ gas supply line 65 extends from the second N₂ gas supply source 55 and supplies N₂ gas to the first H₂ gas supply line 62. The SiH₄ gas supply line 63a extends from the SiH₄ gas supply source 56 and is connected to the second H₂ gas supply line 63.

The first N₂ gas supply line 64 is branched into a first continuous N₂ gas supply line 66 for constantly supplying N₂ gas during film formation using the ALD method and a first flash purge line 67 for supplying N₂ gas only during a purge step. The second N₂ gas supply line 65 is branched into a second continuous N₂ gas supply line 6l for constantly supplying N₂ gas during film formation using the ALD method and a second flash purge line 69 for supplying the N₂ gas only during the purge step. The first continuous N₂ gas supply line 66 and the first flash purge line 67 are connected to a first connection line 70. The first connection line 70 is connected to the raw material gas supply line 61. The second H₂ gas supply line 63, the second continuous N₂ gas supply line 68, and the second flash purge line 69 are connected to a second connection line 71, The second connection line 71 is connected to the first H₂ gas supply line 62. The raw material gas supply line 61 and the first H₂ gas supply line 62 are merged into a confluent pipe 72. The confluent pipe 72 is connected to the gas introduction hole 36 described above.

Opening/closing valves 73, 74, 75, 76, 77, 78, and 79 for switching gases during the ALD process are provided on the most downstream sides of the raw material gas supply line 61, the first H₂ gas supply line 62, the second H₂ gas supply line 63, the first continuous N₂ gas supply line 66, the first flash purge line 67, the second continuous N₂ gas supply line 68, and the second flash purge line 69, respectively. In addition, mass flow controllers 82, 83, 84, 85, 86, and 87, which are flow rate controllers, are provided on the upstream sides of the opening/closing valves in the first H₂ gas supply line 62, the second H₂ gas supply line 63, the first continuous N₂ gas supply line 66, the first flash purge line 67, the second continuous N₂ gas supply line 68, and the second flash purge line 69, respectively. The mass flow controller 83 is provided on the upstream side of a junction of the SiH₄ gas supply line 63a in the second H₂ gas supply line 63. An opening/closing valve 88 is provided between the mass flow controller 83 and the junction. In addition, a mass flow controller 83a and an opening/closing valve 88a are provided in the SiH₄ gas supply line 63a sequentially from the upstream side. Therefore, either or both of H₂ gas and SiH₄ gas can be supplied via the second H₂ gas supply line 63. Buffer tanks 80 and 81 are provided in the raw material gas supply line 61 and the first H₂ gas supply line 62, respectively, so that necessary gases can be supplied in a short period of time. A pressure gauge 80a capable of detecting a pressure inside the buffer tank 80 is provided in the buffer tank 80.

The raw material gas supply mechanism 51 includes a film formation material tank 91 which is a raw material container for receiving, for example, WCl₆. WCl₆ is a raw material that is in a solid state at room temperature. A heater 91a is provided around the film formation material tank 91. Thus, the film formation material in the film formation material tank 91 is heated to an appropriate temperature so that WCl₆ is sublimated to a WCl₆ gas. The above-described raw material gas supply line 61 is inserted into the film formation material tank 91 from above.

The raw material gas supply mechanism 51 further includes a carrier gas pipe 92 inserted into the film formation material tank 91 from above, a carrier N₂ gas supply source 93 for supplying a N₂ gas as a carrier gas to the carrier gas pipe 92, a mass flow controller 94 as a flow rate controller connected to the carrier gas pipe 92, opening/closing valves 95a and 95b provided on the downstream side of the mass flow controller 94, opening/closing valves 96a and 96b provided in the vicinity of the film formation material tank 91 in the raw material gas supply line 61, and a flow meter 97. In the carrier gas pipe 92, the opening/closing valve 95a is provided at a position directly below the mass flow controller 94, and the opening/closing valve 95b is provided on an insertion end side of the carrier gas pipe 92. In addition, the opening/closing valves 96a and 96b and the flow meter 97 are arranged in the order of the opening/closing valve 96a, the opening/closing valve 96b, and the flow meter 97 from an insertion end of the raw material gas supply line 61.

A bypass pipe 98 connects a position between the opening/closing valve 95a and the opening/closing valve 95b of the carrier gas pipe 92 and a position between the opening/closing valve 96a and the opening/closing valve 96b of the raw material gas supply line 61 with each other. An opening/closing valve 99 is installed in the bypass pipe 98. By closing the opening/closing valves 95b and 96a and opening the opening/closing valves 99, 95a, and 96b, the N₂ gas supplied from the carrier N₂ gas supply source 93 is supplied to the raw material gas supply line 61 via the carrier gas pipe 92 and the bypass pipe 98. Therefore, it is possible to purge the raw material gas supply line 61.

A downstream end portion of a dilution N₂ gas supply line 100 for supplying a N₂ gas as a dilution gas is merged with the raw material gas supply line 61 on an upstream side of the flow meter 97. A dilution N₂ gas supply source 101 as a supply source of the N₂ gas is provided in an upstream end portion of the dilution N₂ gas supply line 100. In the dilution N₂ gas supply line 100, a mass flow controller 102 and an opening/closing valve 103 are provided sequentially from the upstream side.

The control device 6 controls operations of the respective components, for example, the exhaust part 4 and the processing gas supply mechanism 5 of the film forming apparatus. The control device 6 includes a central processing unit (CPU), a read only memory (ROM), and a random access memory (RAM). The CPU executes a desired process according to a recipe stored in a memory area such as a RAM or the like. In the recipe, apparatus control information for process conditions is set. The control information may be, for example, a gas flow rate, a pressure, a temperature, and a process time. The recipe and a program used by the control device 6 may be stored in, for example, a hard disk or a semiconductor memory. Alternatively, the recipe or the like may be read out from a portable computer-readable storage medium such as a CD-ROM, a DVD, or the like in which the recipe or the like is set at a predetermined location.

Figure 2:
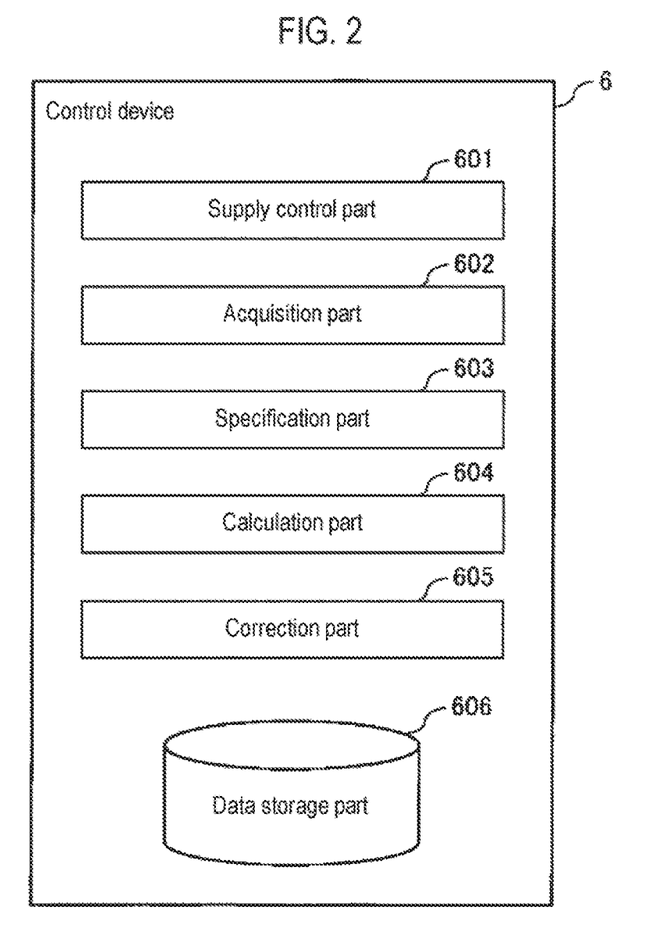
FIG. 2 illustrates a diagram showing a functional configuration example of a control device.

FIG. 2 is a diagram showing a functional configuration example of the control device 6. As shown in FIG. 2, the control device 6 includes a supply control part 601, an acquisition part 602, a specification part 603, a calculation part 604, a correction part 605, and a data storage part 606. The supply control part 601, the acquisition part 602, the specification part 603, the calculation part 604, and the correction part 605 can be realized, for example, by executing a program stored in the ROM by the CPU. The data storage part 606 can be realized by, for example, a hard disk or a semiconductor memory.

The supply control part 601 executes a predetermined process for supplying a mixed gas of the $WCl_6$ gas as a raw material gas and the $N_2$ gas (hereinafter also simply referred to as "mixed gas") at a predetermined target flow rate. The predetermined process may be, for example, an ALD process or a CVD process.

The acquisition part 602 acquires a flow rate of the mixed gas during the predetermined process. The acquisition part 602 acquires the flow rate of the mixed gas flowing through the raw material gas supply line 61 by the flow meter 97 during the predetermined process. The acquisition part 602 may acquire a flow rate of the mixed gas during an entire period from a start time point to an end time point of the predetermined process, or may acquire a flow rate of the mixed gas during a predetermined period in the entire period from the start time point to the end time point of the predetermined process.

The specification part 603 specifies a stable range for the flow rate of the mixed gas acquired by the acquisition part 602. The specification part 603 specifies, as the stable range, for example, a time range in which an amount of change in the flow rate of the mixed gas acquired by the acquisition part 602 is minimized. Alternatively, the specification part 603 may specify, as the stable range, for example, a time range in which the amount of change in the flow rate of the mixed gas acquired by the acquisition part 602 from the start time point of the predetermined process becomes a predetermined threshold value or less for the first time. In an ALD process, a range corresponding to a predetermined number of cycles (for example, ten cycles) out of a plurality of cycles (greater than the predetermined number) may be specified as the stable range, in the case of a CVD process, a predetermined period may be specified as the stable range.

The calculation part 604 calculates a representative value of the flow rates of the mixed gas in the stable range specified by the specification part 603. The representative value may be, for example, an average value of the flow rates of the mixed gas in the stable range specified by the specification part 603, or may be a median value of the flow rates of the mixed gas in the stable range specified by the specification part 603.

The correction part 605 corrects the target flow rate of the mixed gas based on the representative value of the flow rates of the mixed gas in the stable range calculated by the calculation part 604 and the predetermined target flow rate of the mixed gas. The correction part 605 corrects the target flow rate so that, for example, the representative value of the flow rates of the mixed gas in the stable range calculated by the calculation part 604 matches the target flow rate of the mixed gas in the predetermined process.

The data storage part 606 stores the flow rate of the mixed gas in the predetermined process acquired by the acquisition part 602, the stable range for the flow rate of the mixed gas specified by the specification part 603, the representative value of the flow rate of the mixed gas in the stable range calculated by the calculation part 604, the target flow rate of the mixed gas in the predetermined process, and the like. The data storage part 606 stores data such as the flow rate, the stable range, the representative value, the target flow rate, and the like in association with the predetermined process.

[Flow Rate Control Method]

Figure 3:
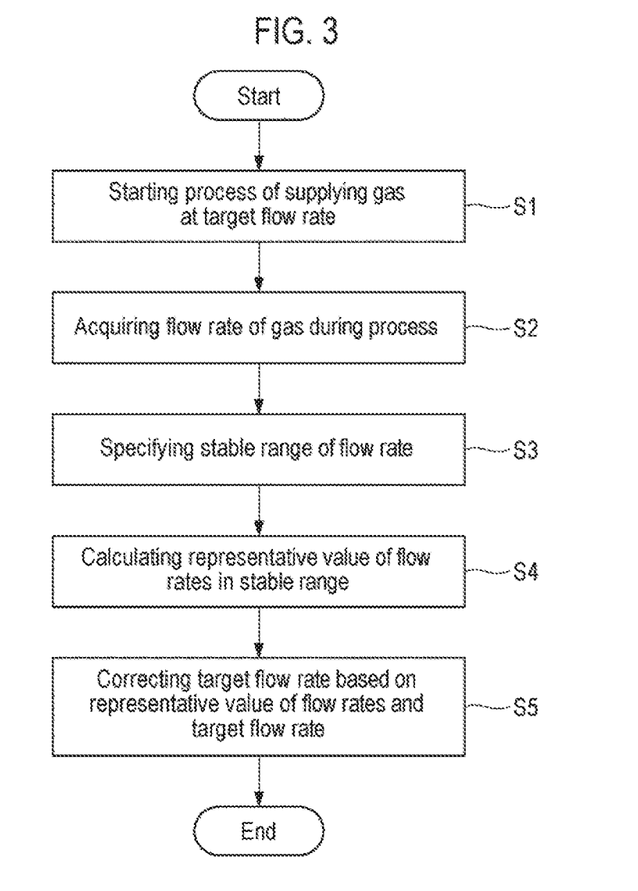
FIG. 3 illustrates a flowchart showing an example of a flow rate control method.

FIG. 3 illustrates a flowchart showing an example of a flow rate control method in a tungsten film formation process using $WCl_6$ gas as a raw material gas. The flow rate control method of FIG. 3 is executed by the control device 6 controlling the respective components of the film forming apparatus.

In step S1, a process of supplying a mixed gas at a predetermined target flow rate is performed. In one embodiment, the supply control part 601 executes an ALD process by controlling operations of the exhaust part 4 and the processing gas supply mechanism 5.

Figure 4:
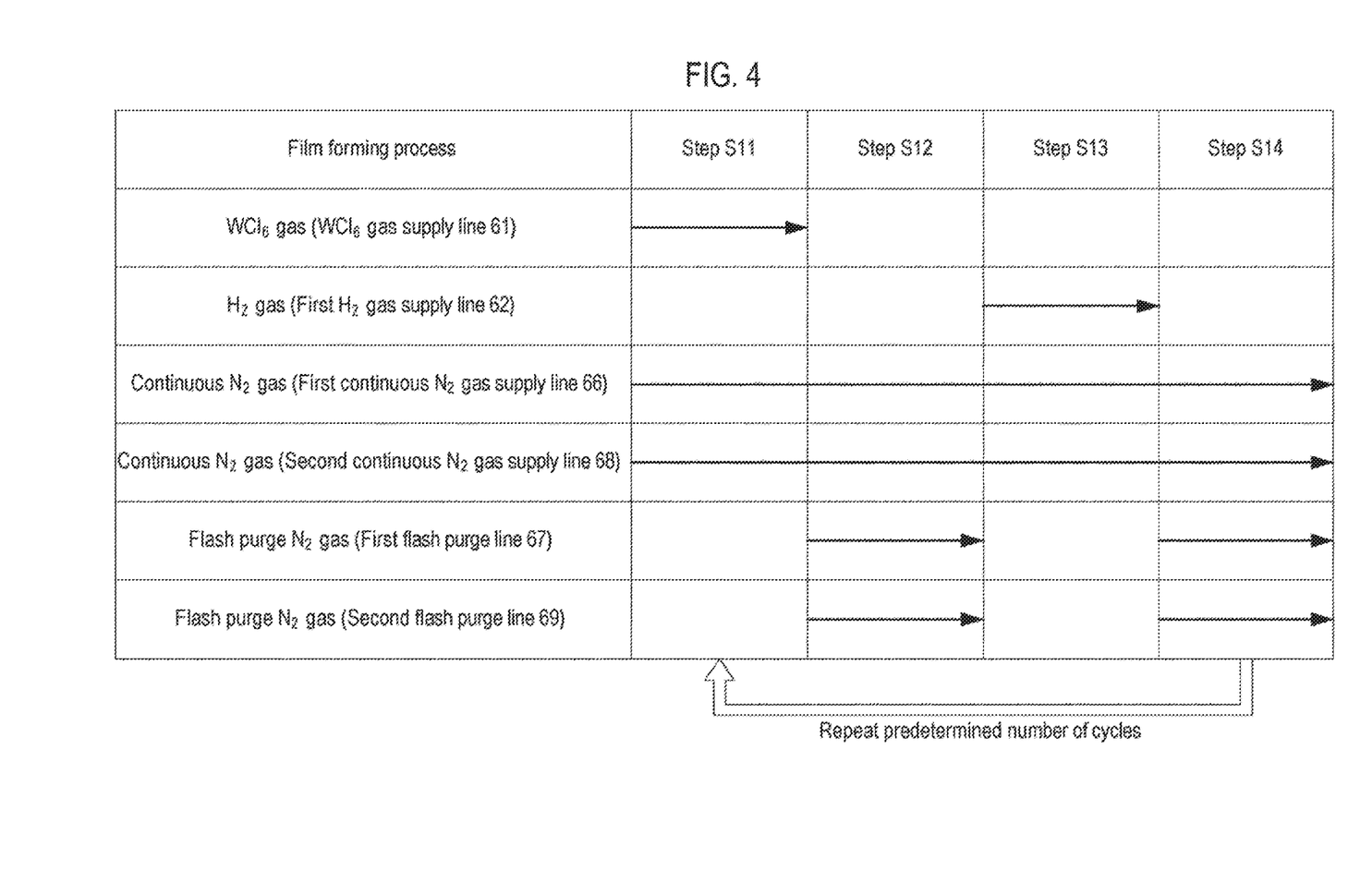
FIG. 4 illustrates a diagram showing an example of a gas supply sequence in an atomic layer deposition (ALD) process.

FIG. 4 illustrates a diagram showing an example of a gas supply sequence in an ALD process. The ALD process of FIG. 4 is a process of forming a tungsten film having a desired film thickness by repeating a cycle in which a raw material gas supply step S11 of supplying $WCl_6$ as a raw material gas, a purge step S12, a reducing gas supply step S13 of supplying $H_2$ as a reducing gas, and a purge step S14 are performed in this order.

The raw material gas supply step S11 is a step of supplying a $WCl_6$ gas into the processing space 37. In the raw material gas supply step S11, first, while the opening/closing valves 76 and 78 are opened, $N_2$ gas is continuously supplied from the first $N_2$ gas supply source 54 and the second $N_2$ gas supply source 55 via the first continuous $N_2$ gas supply line 66 and the second continuous $N_2$ gas supply line 68. In addition, by opening the opening/closing valve 73, the $WCl_6$ gas is supplied from the raw material gas supply mechanism 51 to the processing space 37 in the processing container 1 via the raw material gas supply line 61. At this time, the $WCl_6$ gas is temporarily stored in the buffer tank 80 and then supplied into the processing container 1. In the raw material gas supply step S11, a $H_2$ gas as an additive reducing gas may be supplied into the processing container 1 via the second $H_2$ gas supply line 63 extending from the second $H_2$ gas supply source 53. By supplying the reducing gas together with the $WCl_6$ gas during step S1, the supplied $WCl_6$ gas is activated, which causes a film formation reaction to easily occur in the subsequent reducing gas supply step S13. Therefore, it is possible, while maintaining a high step coverage, to increase a deposited film thickness per cycle and increase a film formation rate. A flow rate of the additive reducing gas may be set such that a CVD reaction does not occur in the raw material gas supply step S11.

The purge step S12 is a step that may include purging an excessive amount of $WCl_6$ gas or the like existing in the processing space 37. In the purge step S12, while continuing the supply of the $N_2$ gas via the first continuous $N_2$ gas supply line 66 and the second continuous $N_2$ gas supply line 68, the opening/closing valve 73 is closed to stop the supply of the $WCl_6$ gas. In addition, by opening the opening/closing valves 77 and 79, the $N_2$ gas (flash purge $N_2$ gas) is also supplied from the first flash purge line 67 and the second flash purge line 69. Thus, the excessive amount of $WCl_6$ gas or the like in the processing space 37 is purged by a mass flow rate of the $N_2$ gas.

The reducing gas supply step S13 is a step of supplying a $H_2$ gas to the processing space 37. In the reducing gas supply step S13, the opening/closing valves 77 and 79 are closed to stop the supply of the $N_2$ gas from the first flash purge line 67 and the second flash purge line 69. In addition, while continuing the supply of the $N_2$ gas via the first continuous $N_2$ gas supply line 66 and the second continuous $N_2$ gas supply line 68, the opening/closing valve 74 is opened. Thus, the $H_2$ gas as a reducing gas is supplied from the first $H_2$ gas supply source 52 to the processing space 37 via the first $H_2$ gas supply line 62. At this time, the $H_2$ gas is temporarily stored in the buffer tank 81 and then supplied into the processing container 1. The reducing gas supply step S13 reduces WCl$_6$ adsorbed on the wafer W. At this time, the flow rate of the H$_2$ gas may be set such that the reducing reaction occurs sufficiently.

The purge step S14 purges an excessive amount of H$_2$ gas existing in the processing space 37. In the purge step S14, while continuing the supply of the N$_2$ gas via the first continuous N$_2$ gas supply line 66 and the second continuous N$_2$ gas supply line 68, the opening/closing valve 74 is closed to stop the supply of the H$_2$ gas from the first N$_2$ gas supply line 62. In addition, the opening/closing valves 77 and 79 are opened to also supply the N$_2$ gas (flash purge N$_2$ gas) from the first flash purge line 67 and the second flash purge line 69. Thus, the excessive amount of H$_2$ gas existing in the processing space 37 is purged by a mass flow rate of the N$_2$ gas.

Returning to FIG. 3, in step S2, a flow rate of the mixed gas during the process of step S1 is acquired. In one embodiment, during the ALD process of step S1, the acquisition part 602 acquires the flow rate of the mixed gas of the WCl$_6$ gas and the N$_2$ gas flowing through the raw material gas supply line 61, which is detected by the flow meter 97. The acquisition part 602 may acquire a flow rate of the mixed gas during an entire period from a start time point to an end time point of the ALD process of step S1, or may acquire a flow rate of the mixed gas during a predetermined period in the entire period from the start time point to the end time point of the ALD process of step S1. The predetermined period may be, for example, a remaining number of cycles excluding a plurality of initial cycles of the ALD process.

In step S3, the stable range for the flow rate of the mixed gas acquired in step S2 is specified. In one embodiment, the specification part 603 specifies, as the stable range, for example, a time range in which an amount of change in the flow rate of the mixed gas acquired by the acquisition part 602 in step S2 is minimized. Alternatively, the specification part 603 may specify, as the stable range, for example, a time range in which the amount of change in the flow rate of the mixed gas acquired by the acquisition part 602 in step S2 from the start time point of the ALD process in step S1 becomes equal to or less than a predetermined threshold value for the first time. The stable range may be, for example, a range corresponding to a predetermined number of cycles (for example, ten cycles) out of a plurality of cycles of the ALD process.

In step S4, a representative value of the flow rates of the mixed gas in the stable range specified in step S3 is calculated. In one embodiment, the calculation part 604 calculates a representative value of the flow rates of the mixed gas in the stable range specified by the specification part 603 in step S3. The representative value may be, for example, an average value of the flow rates of the mixed gas in the stable range specified by the specification part 603, or may be a median value of the flow rates of the mixed gas in the stable range specified by the specification part 603.

In step S5, the target flow rate of the mixed gas is corrected based on the representative value of the flow rates of the mixed gas in the stable range calculated in step S4 and the target flow rate of the mixed gas in the ALD process in step S1. In one embodiment, for example, the correction part 605 correct the target flow rate so that the representative value of the flow rates of the mixed gas in the stable range calculated by the calculation part 604 in step S4 matches the target flow rate of the mixed gas in the ALD process in step S1.

By the above steps S1 to S5, the target flow rate can be corrected. By performing the subsequent ALD process using the corrected target flow rate, the flow rate detected by the flow meter 97 can be brought closer to the target flow rate as compared with the ALD process performed using the pre-correction target flow rate.

Next, a specific example of the flow rate control method of FIG. 3 will be described.

First, description will be made on an example of a case where, using the film forming apparatus shown in FIG. 1, an ALD process in which a cycle of performing the raw material gas supply step S11, the purge step S12, the reducing gas supply step S13, and the purge step S14 shown in FIG. 4 in this order is repeated 20 to 200 times. Conditions for each cycle in the ALD process are the same.

Figure 5A:
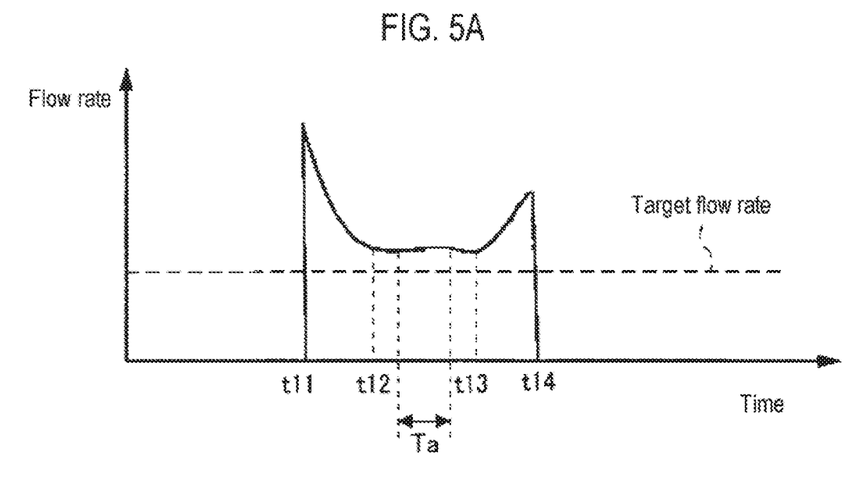
FIGS. 5A and 5B illustrate diagrams showing an example of a relationship between a flow rate of a mixed gas and a time in the ALD process.
Figure 5B:
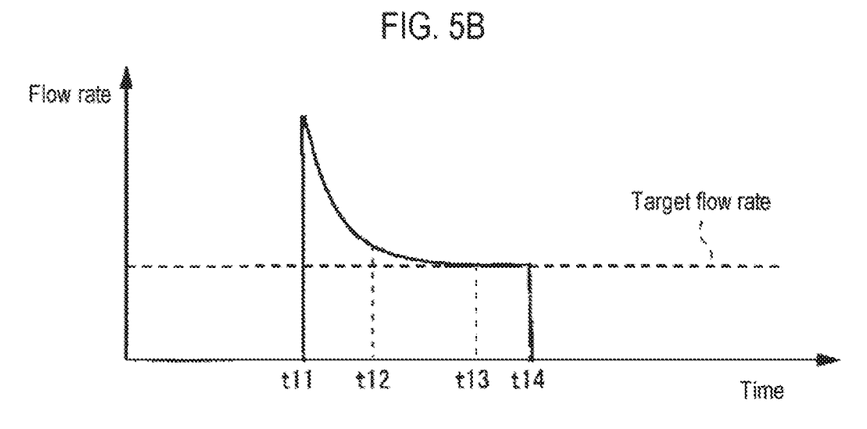

FIGS. 5A and 5B are diagrams showing an example of a relationship between a flow rate of the mixed gas and a time in a specific one cycle when the ALD process is performed. In FIGS. 5A and 5B, the time is indicated on the horizontal axis, and the flow rate of the mixed gas of the WCl$_6$ gas and the N$_2$ gas detected by the flow meter 97 is indicated on the vertical axis. FIG. 5A is a diagram showing the relationship between the time and the flow rate when the ALD process of an Nth cycle (for example, the first cycle) is performed by supplying the mixed gas to the raw material gas supply line 61 at a predetermined target flow rate. FIG. 5B is a diagram showing a relationship between the time and the flow rate when the ALD process of an N+1th cycle (for example, the second cycle) is performed by correcting the target flow rate so that the average value of the flow rates in the period Ta shown in FIG. 5A matches the target flow rate and by supplying the mixed gas to the raw material gas supply line 61 at the corrected target flow rate.

As shown in FIG. 5A, the flow rate of the mixed gas detected by the flow meter 97 during the initial ALD process indicates a value greatly exceeding the target flow rate at the supply start time point (time t11) due to the unstable supply amount. The flow rate of the mixed gas approaches the target flow rate over time, and indicates a stable value for a predetermined period (from time t12 to t13). Then, the flow rate of the mixed gas indicates a gradually increasing value until the supply end time point (time t14).

In this case, the specification part 603 specifies, as the stable range, a period Ta which is a range in which the amount of change in the flow rate of the mixed gas is minimized, the calculation part 604 calculates an average value as a representative value of the flow rates in the period Ta, and the correction part 605 corrects the target flow rate so that the average value of the flow rates in the period Ta matches the target flow rate. Then, the ALD process of the N+1th, cycle is performed by supplying the mixed gas to the raw material gas supply line 61 at the corrected target flow rate. Thus, as shown in FIG. 5B, the flow rate at least in the stable range (from time t12 to t13) can be made equal to or substantially equal to the target flow rate.

Next, description will be made on another example of the case where the aforementioned ALD process is performed using the film forming apparatus shown in FIG. 1. The conditions of each cycle in the ALD process are the same.

Figure 6A:
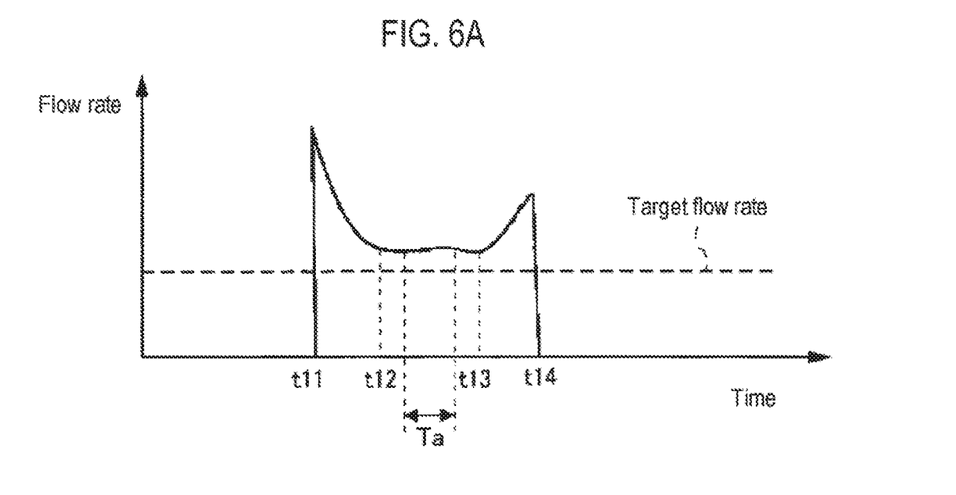
FIGS. 6A and 6B illustrate diagrams showing an example of a relationship between a flow rate of the mixed gas and a time in the ALD process.
Figure 6B:
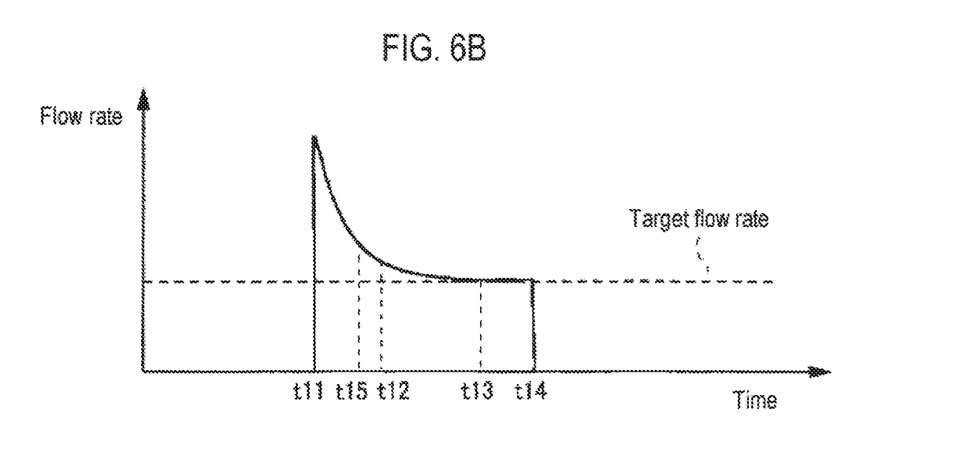

FIGS. 6A and 6B are diagrams showing an example of a relationship between a flow rate of the mixed gas and a time in a specific one cycle when the ALD process is performed. In FIGS. 6A and 6B, the time is indicated on the horizontal axis, and the flow rate of the mixed gas of the WCl$_6$ gas and the N$_2$ gas detected by the flow meter 97 is indicated on the vertical axis. FIG. 6A is a diagram showing the relationship between the time and the flow rate when the ALD process of an Nth cycle (for example, the first cycle) is performed by supplying the mixed gas to the raw material gas supply line 61 at a predetermined target flow rate. FIG. 6B is a diagram showing the relationship between the time and the flow rate when the ALD process of an N+1th cycle (for example, the second cycle) is performed by correcting the target flow rate so that the average value of the flow rates in the period Ta shown in FIG. 6A matches the target flow rate and by supplying the mixed gas at the corrected target flow rate.

As shown in FIG. 6A, the flow rate of the mixed gas detected by the flow meter 97 during the initial ALD process indicates a value greatly exceeding the target flow rate at the supply start time point (time t11) due to the unstable supply amount. The flow rate of the mixed gas approaches the target flow rate over time, and indicates a stable value for a predetermined period (from time t12 to t13). Then, the flow rate of the mixed gas indicates a gradually increasing value until the supply end time point (time t14).

In this case, the specification part 603 specifies, as the stable range, a period Ta which is a range in which the amount of change in the flow rate of the mixed gas is minimized, the calculation part 604 calculates an average value as a representative value of the flow rates in the period Ta, and the correction part 605 corrects the target flow rate so that the average value of the flow rates in the period Ta matches the target flow rate. Then, the supply control part 601 supplies the mixed gas to the raw material gas supply line 61 at a pre-correction target flow rate for the cycle until reaching a predetermined time (time t15) in the ALD process. Furthermore, the supply control part 601 supplies the mixed gas to the raw material gas supply line 61 at a post-correction target flow rate for the cycle after reaching the predetermined time (time t15). Thus, as shown in FIG. 6B, the flow rate detected by the flow meter 97 in the ALD process of the N+1th cycle (for example, the second cycle) can be brought closer to the target flow rate as compared with the ALD process of the Nth cycle (for example, the first cycle).

Figure 7A:
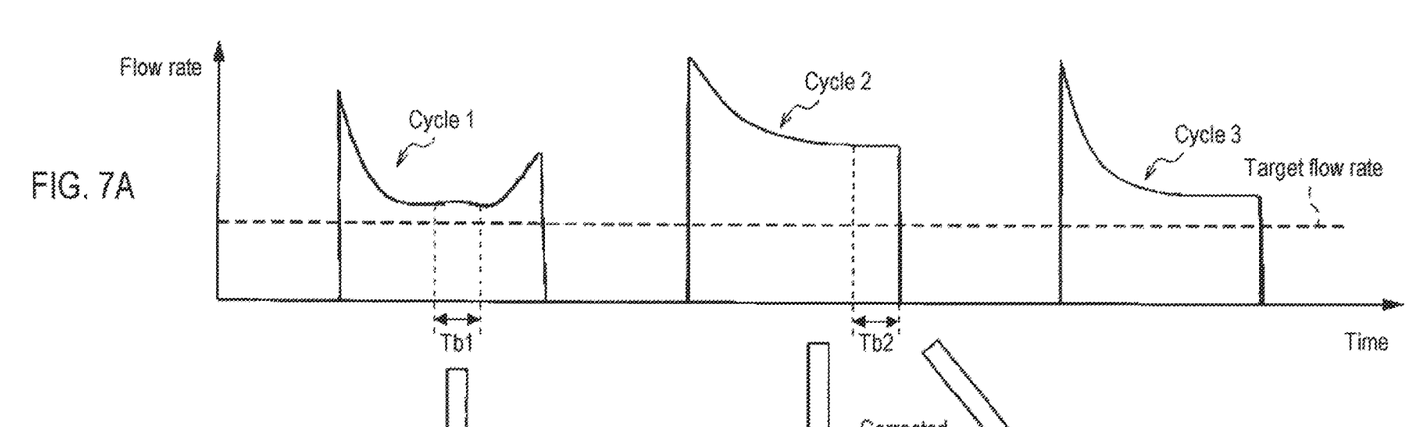
FIGS. 7A and 7B illustrate diagrams showing an example of a relationship between a flow rate of the mixed gas and a time in the ALD process.
Figure 7B:
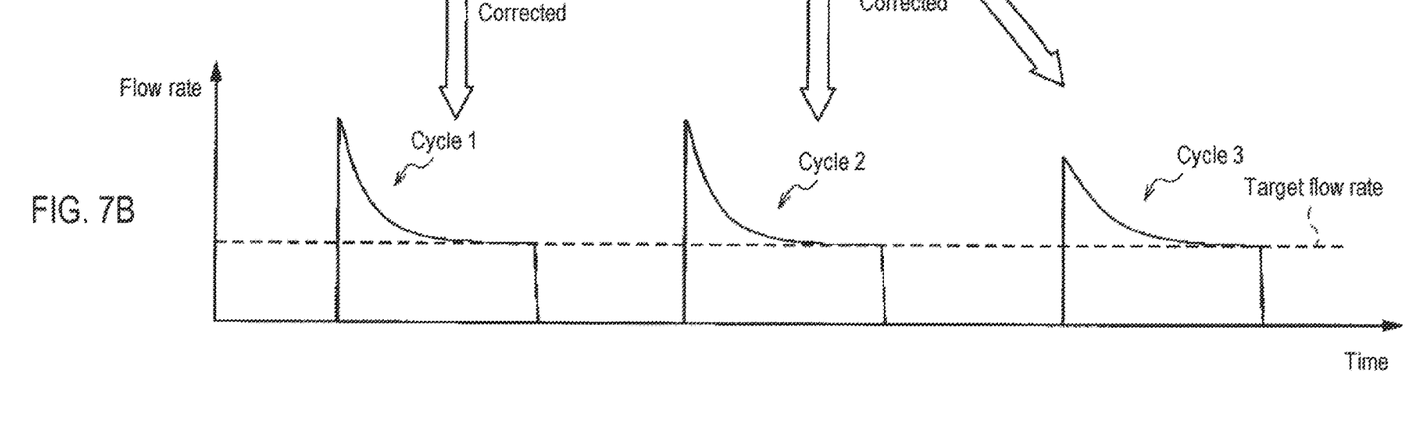

In the above example, a specific cycle in the ALD process was described. However, the present disclosure is not limited thereto. For example, in an embodiment, an average value in a specified period Tb1 in an Mth cycle (for example, "Cycle 1") may be calculated in an Nth ALD process as shown in FIG. 7A, and a corrected target flow rate may be introduced into a specific cycle (for example, "Cycle 1") in an N+1th ALD process as shown in FIG. 7B. Alternatively, average values in respective specified periods Tb1 and Tb2 in a plurality of specific cycles (for example, "Cycles 1" and "Cycle 2") may be calculated in the Nth ALD process as shown in FIG. 7A, and a corrected target flow rate may be introduced into a plurality of specific cycles (for example, "Cycle 1," "Cycle 2" and "Cycle 3") in the N+1th ALD process as shown in FIG. 7B. Here, M and N are both an integer of 1 or more.

Next, a case where the condition (for example, the pressure in the processing container 1) other than the flow rate of the mixed gas in the middle of the above-described ALD process using the film forming apparatus shown in FIG. 1 is changed is described.

Figure 8A:
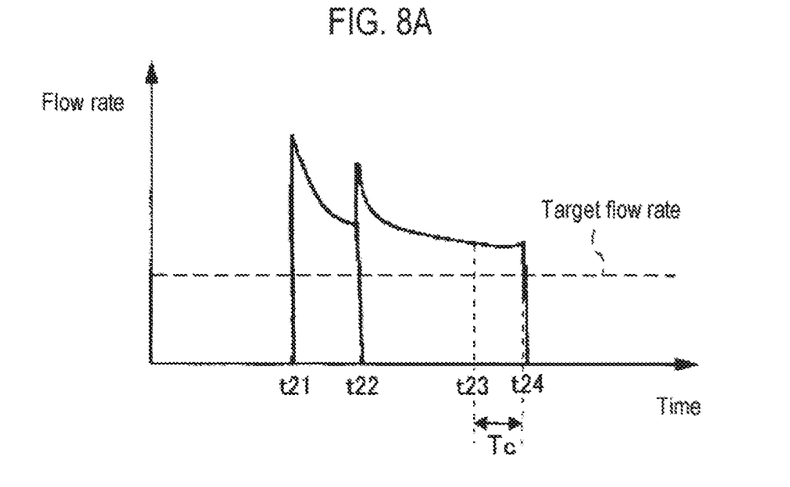
FIGS. 8A and 8B illustrate diagrams showing an example of a relationship between a flow rate of the mixed gas and a time in the ALD process.
Figure 8B:
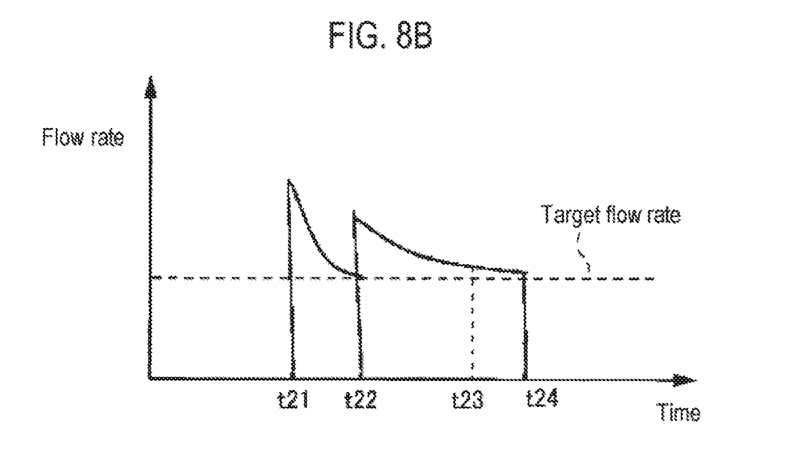

FIGS. 8A and 8B are diagrams showing an example of a relationship between a flow rate of the mixed gas and a time in an ALD process. In FIGS. 8A and 8B, the time is indicated on the horizontal axis, and the flow rate of the mixed gas of the WCl$_6$ gas and the N$_2$ gas detected by the flow meter 97 is indicated on the vertical axis. FIG. 8A is a diagram showing the relationship between the time and the flow rate when the first ALD process including a plurality of cycles is performed by supplying the mixed gas to the raw material gas supply line 61 at a predetermined target flow rate. FIG. 8B is a diagram showing the relationship between the time and the flow rate when the second ALD process including a plurality of cycles is performed by correcting the target flow rate so that the average value of the flow rates in a period Tc shown in FIG. 8A matches the target flow rate and by supplying the mixed gas to the raw material gas supply line 61 at the corrected target flow rate.

As shown in FIG. 8A, the flow rate of the mixed gas detected by the flow meter 97 indicates a value greatly exceeding the target flow rate at the supply start time point (time t21) due to the unstable supply amount. The flow rate of the mixed gas indicates a value approaching the target flow rate over time. Then, when the condition is changed (time t22), the supply amount becomes unstable again. Therefore, the flow rate of the mixed gas indicates a value greatly exceeding the target flow rate. The flow rate of the mixed gas approaches the target flow rate over time and indicates a stable value for a predetermined period (from time t23 to t24).

In this case, the specification part 603 specifies, as the stable range, the period Tc which is a range in which the amount of change in the flow rate of the mixed gas is minimized, the calculation part 604 calculates an average value as a representative value of the flow rates in the period Tc, and the correction part 605 corrects the target flow rate so that the average value of the flow rates in the period Tc matches the target flow rate. Then, the second ALD process including a plurality of cycles is performed by supplying the mixed gas to the raw material gas supply line 61 at the corrected target flow rate. Thus, as shown in FIG. 8B, the flow rate detected by the flow meter 97 in the second ALD process including a plurality of cycles can be brought closer to the target flow rate as compared with the first ALD process including a plurality of cycles.

Next, a case where as an ALD process, a first ALD process is performed and then a second ALD process is performed with a predetermined time left from the first ALD process using the film forming apparatus shown in FIG. 1 is described. In an embodiment, each of the first ALD process and the second ALD process includes a plurality of cycles. The first ALD process is a process of repeating, 20 to 200 times, a cycle in which the raw material gas supply step S11, the purge step S12, the reducing gas supply step S13, and the purge step S14 are performed in this order. The second ALD process is a process of repeating, the same number of times, the same cycle as in the first ALD process. The conditions of each cycle in the ALD process are the same.

Figure 9A:
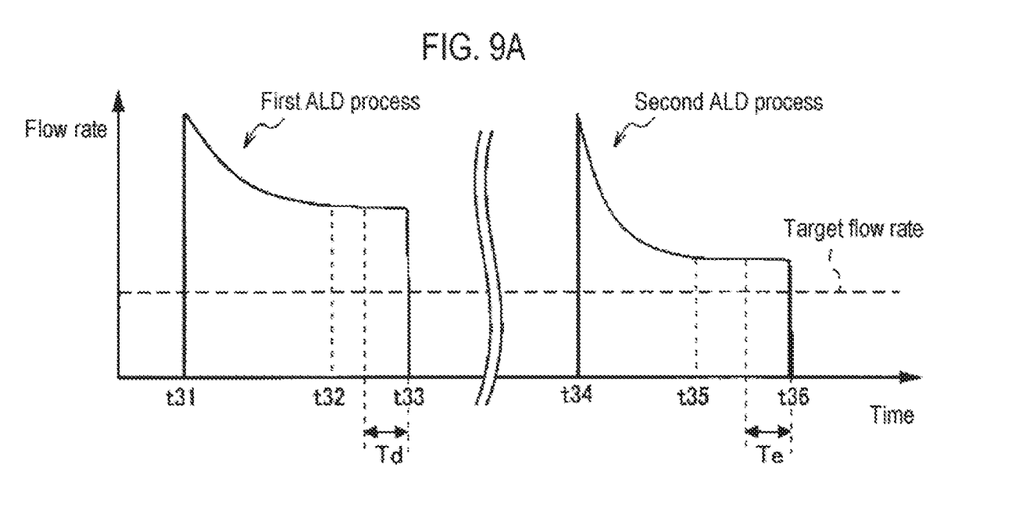
FIGS. 9A and 9B illustrate diagrams showing an example of a relationship between a flow rate of the mixed gas and a time in the ALD process.
Figure 9B:
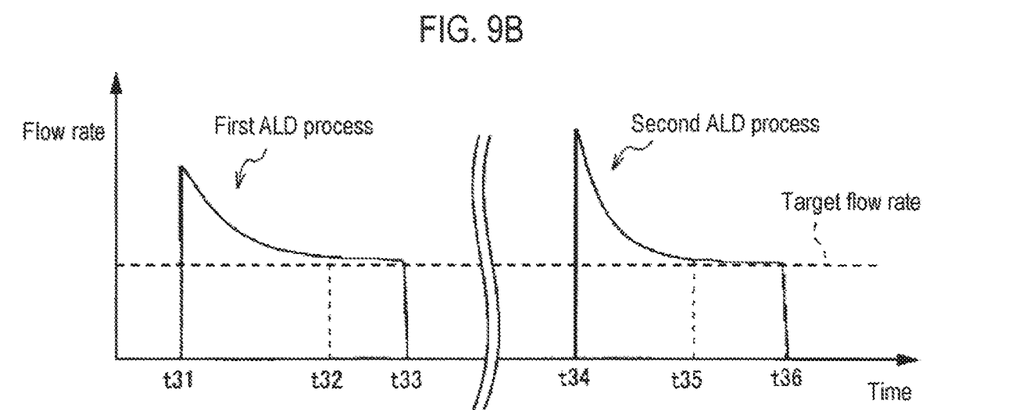

FIGS. 9A and 9B are diagrams showing an example of a relationship between a flow rate of the mixed gas and a time in an ALD process. In FIGS. 9A and 9B, the time is indicated on the horizontal axis, and the flow rate of the mixed gas of the WCl$_6$ gas and the N$_2$ gas detected by the flow meter 97 is indicated on the vertical axis. FIG. 9A is a diagram showing the relationship between the time and the flow rate when the ALD process is performed firstly by supplying the mixed gas to the raw material gas supply line 61 at a predetermined target flow rate. FIG. 9B is a diagram showing the relationship between the time and the flow rate when the ALD process is performed secondly by correcting the target flow rate so that the average value of the flow rates in a period Te shown in FIG. 9A matches the target flow rate and by supplying the mixed gas to the raw material gas supply line 61 at the corrected target flow rate. Each of the firstly performed ALD processes and the secondly performed ALD process includes the first ALD process and the second ALD process.

As shown in FIG. 9A, in the first ALD process, the flow rate of the mixed gas detected by the flow meter 97 indicates a value greatly exceeding the target flow rate at the supply start time point (time t31) due to the unstable supply amount. The flow rate of the mixed gas approaches the target flow rate over time, and indicates a stable value for a predetermined period (from time t32 to t33). Furthermore, in the second ALD process, the flow rate of the mixed gas detected by the flow meter 97 indicates a value greatly exceeding the target flow rate at the supply start time point (time t34) due to the unstable supply amount. The flow rate of the mixed gas approaches the target flow rate over time, and indicates a stable value for a predetermined period (from time t35 to t36). The average value in the stable period Te of the second ALD process indicates a value closer to the target flow rate than the average value in the stable period Td of the first ALD process.

In this case, the correction part 605 corrects the target flow rate so that the average value of the flow rates in the stable period Te of the second ALD process, which is the closer one to the target flow rate among the average values as the representative values of the flow rates in the stable periods Td and Te of the first ALD process and the second ALD process, respectively, matches the target flow rate. Thus, as shown in FIG. 9B, the flow rate detected by the flow meter 97 in the secondly performed ALD process can be brought closer to the target flow rate as compared with the firstly performed ALD process.

As explained above, with the flow rate control method according to the embodiment of the present disclosure, the mixed gas is supplied at a predetermined target flow rate, the flow rate of the supplied mixed gas is acquired, the stable range of the acquired flow rate of the mixed gas is specified, the representative value of the flow rates of the mixed gas in the specified stable range is calculated, and the target flow rate is corrected based on the calculated representative value and the target flow rate. Thus, it is possible to automatically determine a stable section of the flow rate of the raw material gas in a predetermined process and to correct the target flow rate. This makes it possible to adjust the flow rate of the raw material gas with high accuracy.

It should be understood that the embodiment disclosed in the present disclosure is exemplary in all respects and is not restrictive. The above-described embodiment may be omitted, replaced or modified in various forms without departing from the scope and spirit of the appended claims.

In the above-described embodiment, the case where a tungsten film is formed using a $WCl_6$ gas as a metal chloride gas was described. However, other tungsten chloride gases such as a $WCl_5$ gas and the like may be used instead of the $WCl_6$ gas. In the case of using the $WCl_5$ gas, for example, $WCl_5$ which is in a solid state at room temperature may be used as a film forming material. Instead of the tungsten chloride gas, for example, a molybdenum chloride gas or a tantalum chloride gas may be used. In the case of using the molybdenum chloride gas, for example, molybdenum chloride which is in a solid state at room temperature may be used as a film-forming material. In the case of using the tantalum chloride gas, for example, tantalum chloride which is in a solid state at room temperature may be used as a film-forming material. In the case of using the molybdenum chloride gas and the tantalum chloride gas, it is possible to form a molybdenum film and a tantalum film, respectively.

In the above-described embodiment, the case where solid raw material is sublimed to generate a raw material gas was described. However, it is also possible to vaporize liquid raw material to generate a raw material gas.

In the above-described embodiment, the case where a $H_2$ gas is used as a reducing gas was described. However, the reducing gas may be an arbitrary reducing gas containing hydrogen. Instead of the $H_2$ gas, it may be possible to use a $SiH_4$ gas, a $B_2H_6$ gas, an $NH_3$ gas, or the like. Moreover, it may be possible to use two or more of the $H_2$ gas, the $SiH_4$ gas, the $B_2H_6$ gas, and the $NH_3$ gas. It may also be possible to use reducing gases, for example, a $PH_3$ gas and a $SiH_2Cl_2$ gas, other than the above-described gases. From the viewpoint of further reducing impurities in a film to obtain a low resistance value, the $H_2$ gas may be used.

In the above-described embodiment, the case where a $N_2$ gas is used as a purge gas and a carrier gas was described. However, other inert gases such as an Ar gas and the like may be used instead of the $N_2$ gas.

In the above-described embodiment, the case where the ALD process based on FIG. 4 is carried out in step S1 was described. However, instead of the ALD process, for example, a CVD process may be carried out.

In the above-described embodiment, the case where a $H_2$ gas is supplied in the reducing gas supply step S13 has been described. However, a purge gas may be supplied instead of the $H_2$ gas. By supplying the purge gas instead of the $H_2$ gas, the tungsten film is not formed inside the processing space 37. Therefore, the flow rate control method of FIG. 3 can be carried out without mounting the wafer W on the susceptor 2. That is to say, regardless of the presence or absence of a semiconductor wafer in the processing container 1, the flow rate control method of FIG. 3 can be carried out. In other words, after the flow rate is stabilized by carrying out the flow rate control method of FIG. 3 in a state in which a semiconductor wafer is not present in the processing container 1, a process may be executed by loading the semiconductor wafer into the processing container 1. Alternatively, the flow rate control method of FIG. 3 may be carried out while a process is executed after a semiconductor wafer is loaded into the processing container 1.

In the above-described embodiment, the case where the substrate is the semiconductor wafer has been described. The semiconductor wafer may be a silicon wafer or may be a compound semiconductor wafer such as GaAs, SiC, GaN, or the like. In addition, as the substrate, a glass substrate used for a flat panel display (FPD) such as a liquid crystal display device or the like, a ceramic substrate, or the like may be used instead of the semiconductor wafer.

According to the present disclosure in some embodiments, it is possible to adjust a flow rate of a raw material gas with high accuracy.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of controlling flow rate in a gas supply device for supplying a mixed gas containing a raw material gas, which is generated by vaporizing a raw material in a raw material container, and a carrier gas, the method comprising:
supplying the mixed gas at a predetermined target flow rate;
acquiring actual flow rates of the mixed gas in plural times after supplying the mixed gas;

specifying a tolerance range of the actual flow rates of the mixed gas acquired when acquiring the actual flow rates, wherein the specifying a tolerance range is configured to specify, as the tolerance range, a time range in which an amount of change in the actual flow rates of the mixed gas acquired in the acquiring actual flow rates from a start time point of a predetermined process becomes a predetermined threshold value or less for a first time;

calculating a representative value of the actual flow rates of the mixed gas from the tolerance range specified when specifying the tolerance range, the representative value being an average value of the actual flow rates of the mixed gas during the time range; and correcting a subsequent target flow rate of the mixed gas based on the representative value calculated when calculating the representative value and the predetermined target flow rate such that the representative value matches the predetermined target flow rate.

2. The method of claim 1, wherein the specifying a tolerance range further includes specifying, as the tolerance range, a range in which the amount of change in the actual flow rates of the mixed gas is minimized.

3. The method of claim 1, wherein the supplying the mixed gas further includes a plurality of mixed gas supply steps performed consecutively, the plurality of mixed gas supply steps differing from one another in at least one condition other than the actual flow rates of the mixed gas.

4. The method of claim 1, wherein the supplying the mixed gas further includes a plurality of mixed gas supply steps performed intermittently under the same condition, wherein the specifying a tolerance range further includes specifying tolerance ranges of the actual flow rates of the mixed gas for the respective plurality of mixed gas supply steps, wherein the calculating a representative value further includes calculating representative values for the respective tolerance ranges specified in the specifying a tolerance range, and wherein the correcting a subsequent target flow rate further includes correcting the subsequent target flow rate based on one of the representative values, which is closest to the predetermined target flow rate among the representative values calculated in calculating a representative value, and the predetermined target flow rate.

5. The method of claim 1, wherein a cycle including the supplying the mixed gas, the acquiring actual flow rates, the specifying a tolerance range, the calculating a representative value, and the correcting a subsequent target flow rate is performed a plurality of times, wherein the supplying the mixed gas further includes a plurality of mixed gas supply steps performed intermittently, wherein the correcting a subsequent target flow rate further includes correcting the subsequent target flow rate of a specific one of the plurality of mixed gas supply steps in an N+1th cycle based on the representative value of an Mth mixed gas supply step in an Nth cycle calculated when calculating the representative value and the predetermined target flow rate, where M is an integer of one or more and N is an integer of one or more.

6. The method of claim 1, wherein a cycle including the supplying the mixed gas, the acquiring actual flow rates, the specifying a tolerance range, the calculating a representative value, and the correcting a subsequent target flow rate is performed a plurality of times, wherein the supplying the mixed gas further includes intermittently performing a plurality of mixed gas supply steps, wherein the correcting a subsequent target flow rate further includes correcting the subsequent target flow rate of each of specific ones of the plurality of mixed gas supply steps in an N+1th cycle based on a representative value, which is closest to the predetermined target flow rate among a plurality of representative values of the mixed gas supply steps in an Nth cycle calculated when calculating the representative value, and the predetermined target flow rate.

7. The method of claim 1, wherein the supplying the mixed gas further includes temporarily storing the mixed gas in a buffer tank and intermittently supplies the mixed gas.

8. The method of claim 1, wherein the raw material is a solid raw material of tungsten chloride.

* * * * *